US011948976B2

(12) United States Patent
Tawara et al.

(10) Patent No.: US 11,948,976 B2
(45) Date of Patent: Apr. 2, 2024

(54) VERTICAL MOSFET HAVING TRENCH GATE STRUCTURE CONTAINING SILICON CARBIDE

(71) Applicant: FUJI ELECTRIC CO., LTD., Kawasaki (JP)

(72) Inventors: Takeshi Tawara, Tsukuba (JP); Hidekazu Tsuchida, Yokosuka (JP); Koichi Murata, Yokosuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 230 days.

(21) Appl. No.: 17/514,673

(22) Filed: Oct. 29, 2021

(65) Prior Publication Data

US 2022/0190114 A1 Jun. 16, 2022

(30) Foreign Application Priority Data

Dec. 15, 2020 (JP) .................. 2020-207277

(51) Int. Cl.
*H01L 29/08* (2006.01)
*H01L 29/167* (2006.01)
(Continued)

(52) U.S. Cl.
CPC ........ *H01L 29/0878* (2013.01); *H01L 29/167* (2013.01); *H01L 29/7805* (2013.01); *H01L 29/1608* (2013.01); *H01L 29/7813* (2013.01)

(58) Field of Classification Search
CPC ............... H01L 29/0878; H01L 29/167; H01L 29/7805; H01L 29/1608; H01L 29/7813;
(Continued)

(56) References Cited

U.S. PATENT DOCUMENTS

2009/0090920 A1* 4/2009 Endo ................... H01L 29/7813
257/77
2013/0075783 A1* 3/2013 Yamazaki ............. H01L 21/263
257/E29.198
(Continued)

FOREIGN PATENT DOCUMENTS

| JP | 2018-019047 A | 2/2018 |
| JP | 2019-080035 A | 5/2019 |
| JP | 2019-140242 A | 8/2019 |

*Primary Examiner* — Cuong B Nguyen
(74) *Attorney, Agent, or Firm* — Rabin & Berdo. P.C.

(57) ABSTRACT

A vertical metal oxide semiconductor field effect transistor, including a starting substrate of a first conductivity type, a second first-conductivity-type epitaxial layer provided on a first surface of the starting substrate via a first first-conductivity-type epitaxial layer, a first semiconductor region of the first conductivity type provided as a portion of the second first-conductivity-type epitaxial layer, a second-conductivity-type epitaxial layer forming a pn junction interface with the second first-conductivity-type epitaxial layer and supplying a minority carrier to the second first-conductivity-type epitaxial layer, a plurality of second semiconductor regions of the first conductivity type selectively provided in the second-conductivity-type epitaxial layer, a plurality of trenches penetrating through the second semiconductor regions and the second-conductivity-type epitaxial layer, and a plurality of gate electrodes provided in the trenches via gate insulating films. A lifetime of the minority carrier of the first semiconductor region is shorter than that of the rest of the second first-conductivity-type epitaxial layer.

7 Claims, 9 Drawing Sheets

(51) Int. Cl.
*H01L 29/78* (2006.01)
*H01L 29/16* (2006.01)

(58) Field of Classification Search
CPC ............. H01L 29/7811; H01L 29/0615; H01L 29/0638; H01L 29/0661; H01L 29/1095; H01L 29/36; H01L 29/0623; H01L 29/0696; H01L 29/7375; H01L 29/7393–7395; H01L 29/7397; H01L 29/66325; H01L 29/66333–66348
See application file for complete search history.

(56) References Cited

U.S. PATENT DOCUMENTS

| | | |
|---|---|---|
| 2018/0323263 A1 | 11/2018 | Tawara et al. |
| 2019/0252503 A1 | 8/2019 | Uehigashi |

\* cited by examiner

VERTICAL MOSFET HAVING TRENCH GATE STRUCTURE CONTAINING SILICON CARBIDE

CROSS REFERENCE TO RELATED APPLICATIONS

This application is based upon and claims the benefit of priority of the prior Japanese Patent Application No. 2020-207277, filed on Dec. 15, 2020, the entire contents of which are incorporated herein by reference.

BACKGROUND OF THE INVENTION

1. Field of the Invention

Embodiments of the invention relate to a vertical MOSFET having a trench gate structure containing silicon carbide.

2. Description of the Related Art

Conventionally, a trench-gate metal oxide semiconductor field effect transistor (MOSFET) includes insulated gates having a 3-layered structure including a metal, an oxide film, and a semiconductor and in trench gate MOSFET having a breakdown voltage of about 1.2 kV and in which silicon carbide (SiC) is used as a semiconductor material, a semiconductor substrate is used in which, as an $n^+$-type buffer layer, an epitaxial layer having a short minority carrier (hole) lifetime is stacked on an $n^+$-type starting substrate constituting an $n^+$-type drain region.

Figure 11:
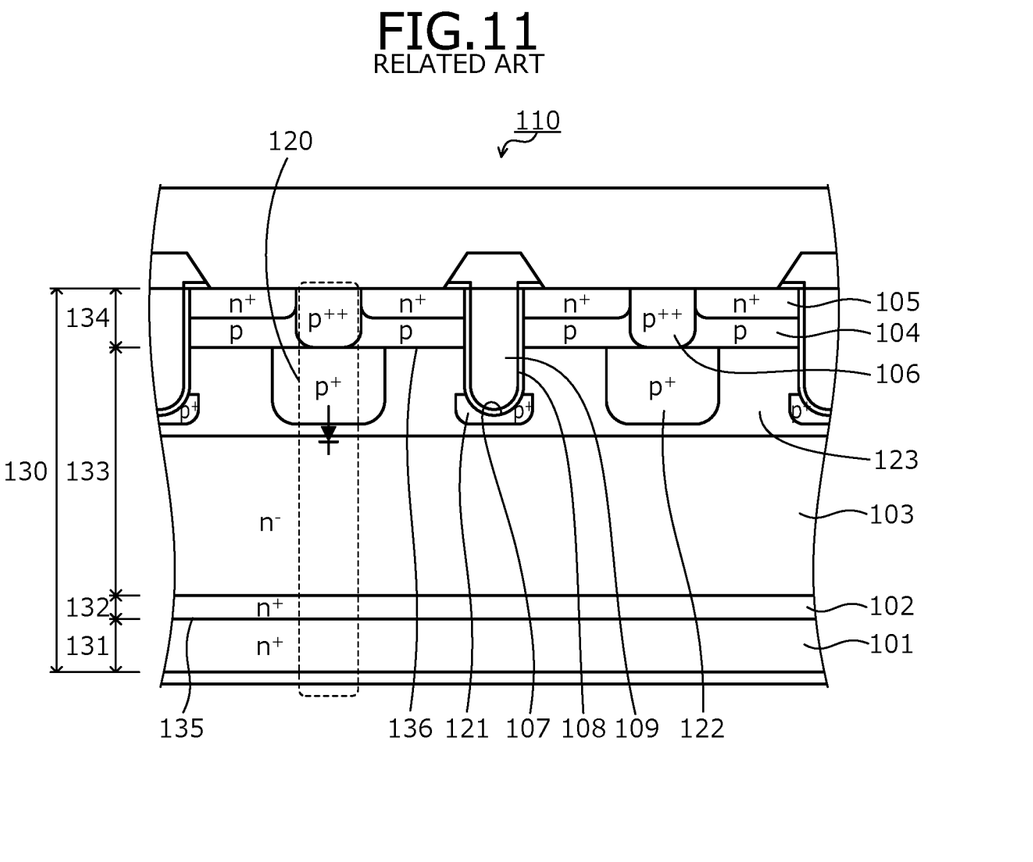
FIG. 11 is a cross-sectional view depicting a structure of a conventional silicon carbide semiconductor device.

A structure of a conventional silicon carbide semiconductor device is described. FIG. 11 is a cross-sectional view depicting the structure of the conventional silicon carbide semiconductor device. A conventional silicon carbide semiconductor device 110 depicted in FIG. 11 is a vertical MOSFET having a trench gate structure fabricated using a semiconductor substrate 130 in which epitaxial layers 132, 133, 134 constituting an $n^+$-type buffer layer 102, an $n^-$-type drift layer 103, and p-type base regions 104 are sequentially stacked on an $n^+$-type starting substrate 131 ($n^+$-type drain region 101) in which 4-layer periodic hexagonal crystal silicon carbide (4H-SiC) is used as a semiconductor material.

The $n^+$-type buffer layer 102 is the $n^+$-type epitaxial layer 132 having an impurity concentration at least equal to that of the $n^+$-type starting substrate 131; and a minority carrier lifetime of the $n^+$-type buffer layer 102 is sufficiently shorter than that of the $n^-$-type drift layer 103. The $n^+$-type buffer layer 102 is designed so as to suppress expansion of stacking faults from an interface between 135 the epitaxial layers 132, 133, 134 and the $n^+$-type starting substrate 131 to inside the epitaxial layers 132, 133, 134, during forward conduction of parasitic diodes 120 formed by pn junctions (junction interfaces indicated by reference numeral 136) of $p^{++}$-type contact regions 106, the p-type base regions 104, $p^+$-type regions 122, an n-type current spreading region 123, the $n^-$-type drift layer 103, the $n^+$-type buffer layer 102, and the $n^+$-type drain region 101.

As a freewheeling diode (FWD) for an inverter connected in antiparallel to the MOSFET, in addition to an external Schottky barrier diode (SBD), the parasitic diodes 120 of MOSFET are used, enabling reduction of the number of device elements mounted to an inverter circuit. Reference numerals 105, 107, 108, and 109 are respectively $n^+$-type source regions, trenches, gate insulating films, and gate electrodes configuring the trench gate structure. Reference numerals 121 and 122 are $p^+$-type regions having a function of mitigating electric field applied to bottoms of the trenches 107.

As a conventional MOSFET in which silicon carbide is used as a semiconductor material, a device having an $n^+$-type starting substrate with a minority carrier lifetime that is at most 100 nsec and preferably, at most 2.5 ns has been proposed (for example, refer to Japanese Laid-Open Patent Publication No. 2019-140242. In Japanese Laid-Open Patent Publication No. 2019-140242, a silicon carbide single crystal ingot is formed by single-crystal growth under a condition of a growth surface temperature of at least 2300 degrees C. Further, during the single-crystal growth for the silicon carbide single crystal ingot, vanadium (V), etc. that creates a deep level with respect to silicon carbide is introduced, whereby minority carrier lifetime is shortened.

Further, as a conventional MOSFET in which silicon carbide is used as a semiconductor material, a device has been proposed in which an $n^-$-type drift region is irradiated with helium (He) or an electron beam, a $Z_{1/2}$ center is introduced, and the minority carrier lifetime of the $n^-$-type drift region is at most 1 µsec, or preferably at most 0.1 µsec, or more preferably at most 0.05 µsec (for example, refer to Japanese Laid-Open Patent Publication No. 2019-140242, Japanese Laid-Open Patent Publication No. 2019-080035). In Japanese Laid-Open Patent Publication No. 2019-140242 and Japanese Laid-Open Patent Publication No. 2019-080035, in an entire area of the $n^-$-type drift region, the $Z_{1/2}$ center is introduced whereby the minority carrier lifetime is shortened.

Further, as a conventional semiconductor device in which silicon carbide is used as a semiconductor material, a device has been proposed in which in an $n^+$-type buffer layer, vanadium, etc. that forms a deep level with respect to silicon carbide is introduced as a lifetime killer, whereby the minority carrier lifetime is shortened (for example, refer to Japanese Laid-Open Patent Publication No. 2018-019047). In Japanese Laid-Open Patent Publication No. 2018-019047, the $n^+$-type buffer layer is epitaxially grown while nitrogen (N) and a lifetime killer are doped, thereby introducing the lifetime killer into the $n^+$-type buffer layer.

SUMMARY OF THE INVENTION

According to an embodiment of the invention, a vertical metal oxide semiconductor field effect transistor (MOSFET) contains silicon carbide and has a pn junction interface through which a current passes in a forward direction, the vertical MOSFET including a starting substrate of a first conductivity type, having a first surface and a second surface opposite to each other; a first first-conductivity-type epitaxial layer containing silicon carbide; a second first-conductivity-type epitaxial layer containing silicon carbide, provided on the first surface of the starting substrate via the first first-conductivity-type epitaxial layer, the second first-conductivity-type epitaxial layer containing silicon carbide having an impurity concentration lower than an impurity concentration of the starting substrate and an impurity concentration of the first first-conductivity-type epitaxial layer, the second first-conductivity-type epitaxial layer further containing, as an impurity thereof, a first element that is a dopant of the first conductivity type; a first semiconductor region of the first conductivity type, provided as a portion of the second first-conductivity-type epitaxial layer, in contact with the first first-conductivity-type epitaxial layer, the first semiconductor region having, as an impurity thereof, the first element and a second element, the second element forming recombination centers; a second-conductivity-type epitaxial layer containing silicon carbide, the second-conductivity-type epitaxial layer forming the pn junction interface with the second first-conductivity-type epitaxial layer and supplying a minority carrier to the second first-conductivity-type epitaxial layer that includes the first semiconductor region; a plurality of second semiconductor regions of the first conductivity type, selectively provided in the second-conductivity-type epitaxial layer; a plurality of trenches that penetrate through the plurality of second semiconductor regions, respectively, and through the second-conductivity-type epitaxial layer, and reach the second first-conductivity-type epitaxial layer; a plurality of gate electrodes that are provided in the plurality of trenches via a plurality of gate insulating films, respectively; a first electrode electrically connected to the second semiconductor regions and the second-conductivity-type epitaxial layer; and a second electrode electrically connected to the second surface of the starting substrate. A lifetime of the minority carrier of the first semiconductor region is shorter than a lifetime of the minority carrier of another portion of the second first-conductivity-type epitaxial layer excluding the first semiconductor region. A concentration of the second element in the first semiconductor region is at most ⅟₁₀ of a concentration of the first element in the second first-conductivity-type epitaxial layer.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. In an instance in which the parasitic diodes 120 of the MOSFET (refer to FIG. 11) are used as freewheeling diodes for an inverter, a problem arises in that as compared to an instance in which an external SBD is used, during a switching operation whereby the freewheeling diode turns OFF from an ON state, a current peak (maximum value) of reverse current (reverse recovery current) passing through the freewheeling diode increases and surge current is applied to device elements configuring the inverter circuit. A reason for this is as follows.

During forward conduction of the parasitic diode 120, electrons and holes from the n⁺-type buffer layer 102 and the p-type base regions 104 flow into and accumulate in the n⁻-type drift layer 103. Carriers accumulated in the n⁻-type drift layer 103 are discharged as a reverse current Irr during the switching operation by which the parasitic diode 120 turns OFF from the ON state. Therefore, reverse current passing through the parasitic diode 120 increases as compared to the external SBD.

Figure 4:
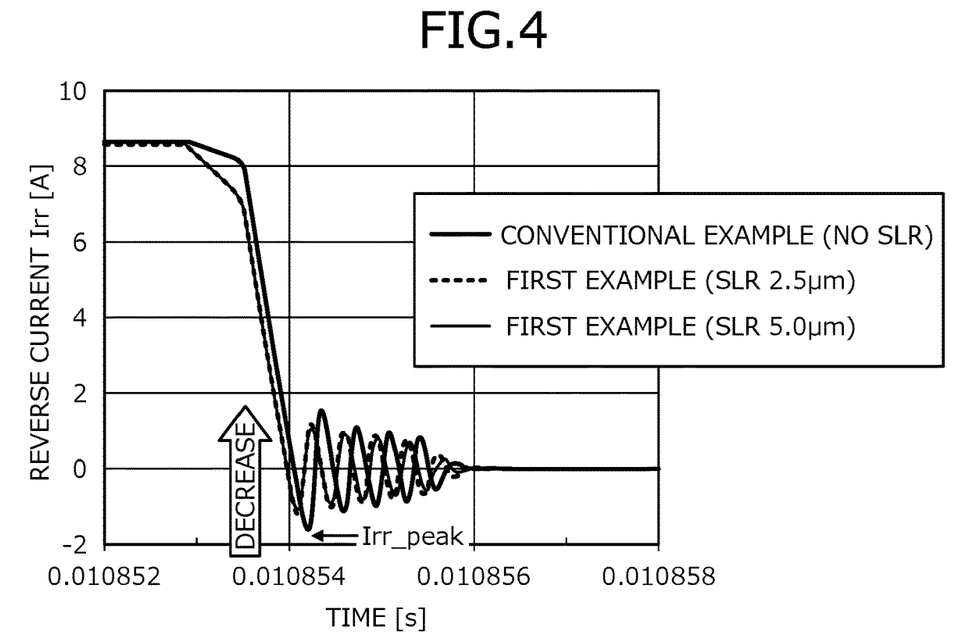
FIG. 4 a characteristics diagram depicting a reverse current waveform of a parasitic diode of a first example.
Figure 5:
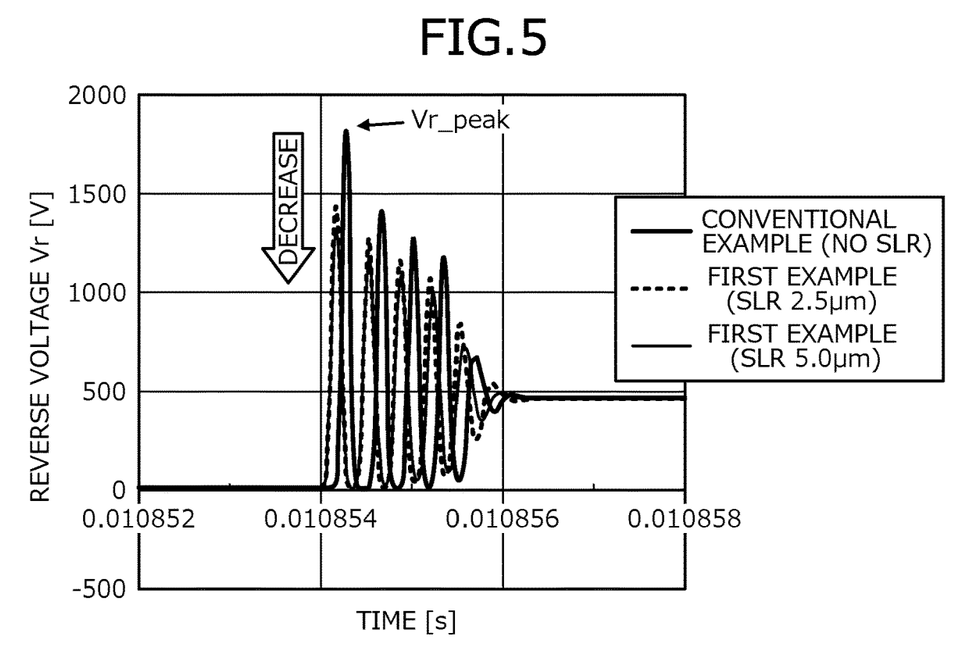
FIG. 5 is a characteristics diagram depicting a reverse voltage waveform of the parasitic diode of the first example.

Therefore, during the switching operation by which the parasitic diode 120 turns OFF from the ON state, when the carriers accumulated in the n⁻-type drift layer 103 are discharged, a current peak Irr_peak of the reverse current Irr passing through the parasitic diode 120 increases (refer to a conventional example in FIG. 4) and a voltage peak (maximum value) Vr_peak of reverse voltage Vr applied to the parasitic diode 120 increases, becoming surge voltage (refer to conventional example in FIG. 5).

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
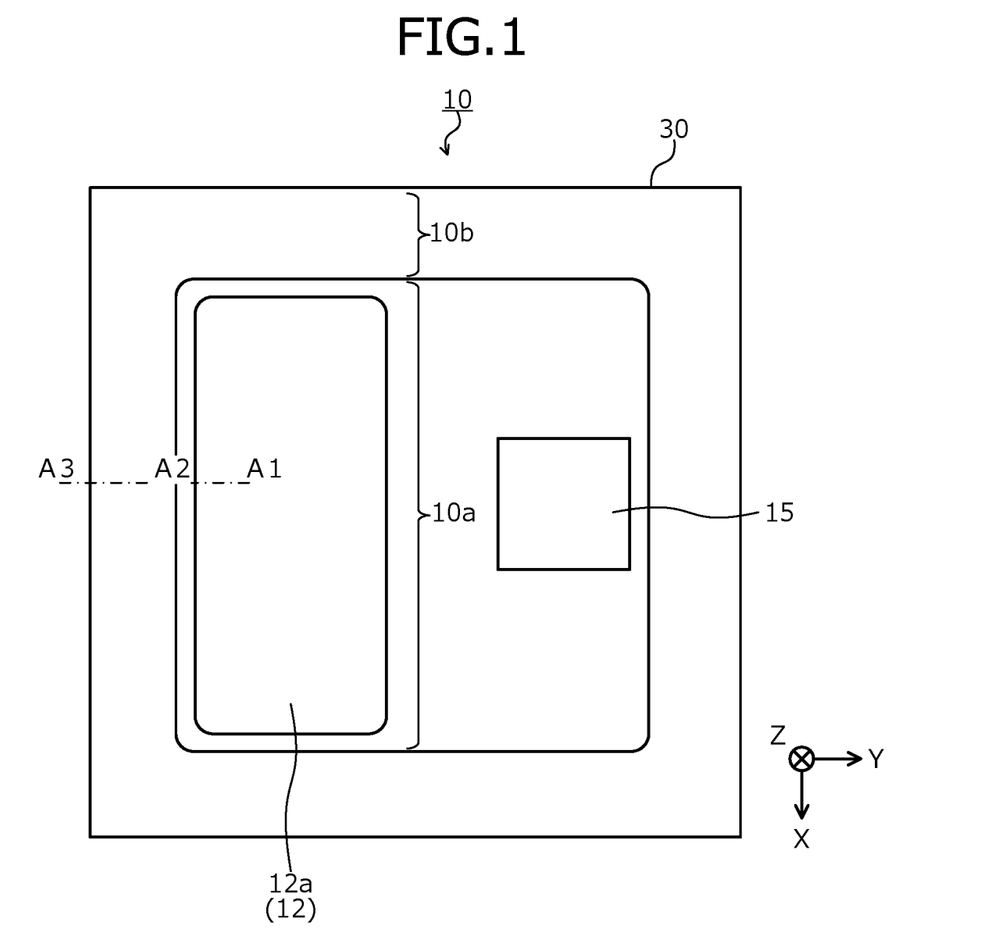
FIG. 1 is a plan view depicting a layout when a silicon carbide semiconductor device according to an embodiment is viewed from a front side of a semiconductor substrate.
Figure 2:
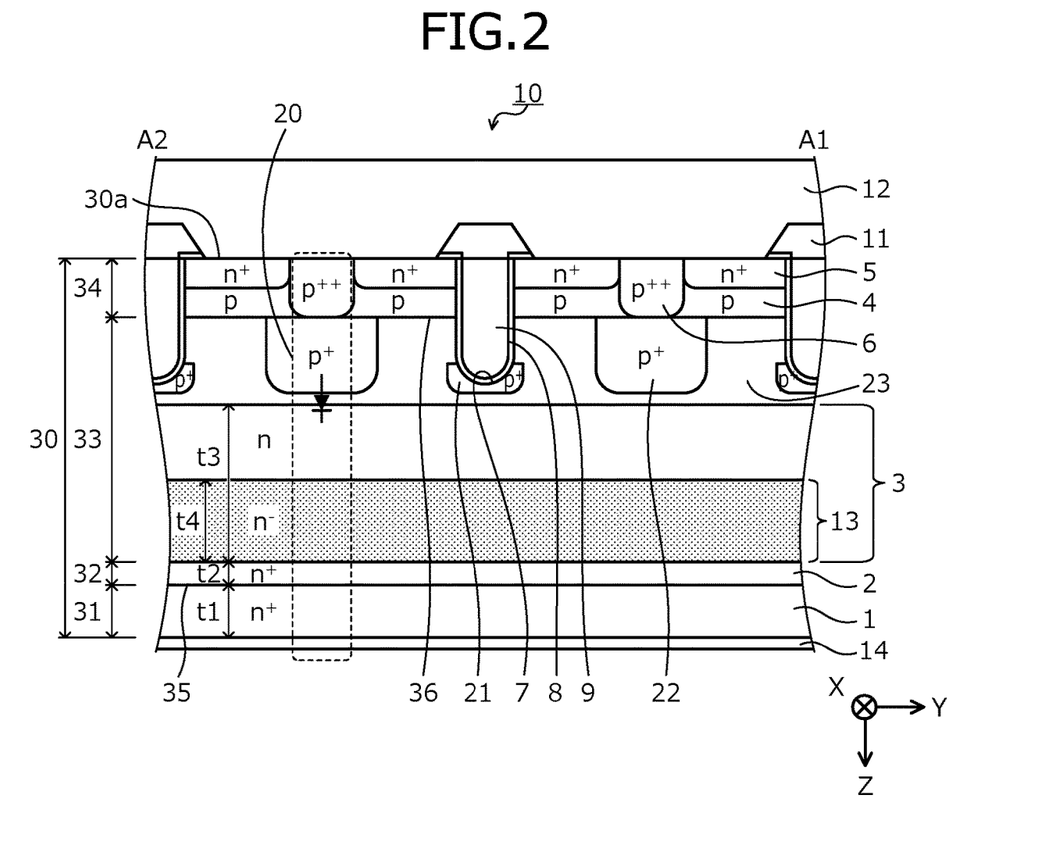
FIG. 2 is a cross-sectional view of a structure along cutting line A1-A2 in FIG. 1.
Figure 3:
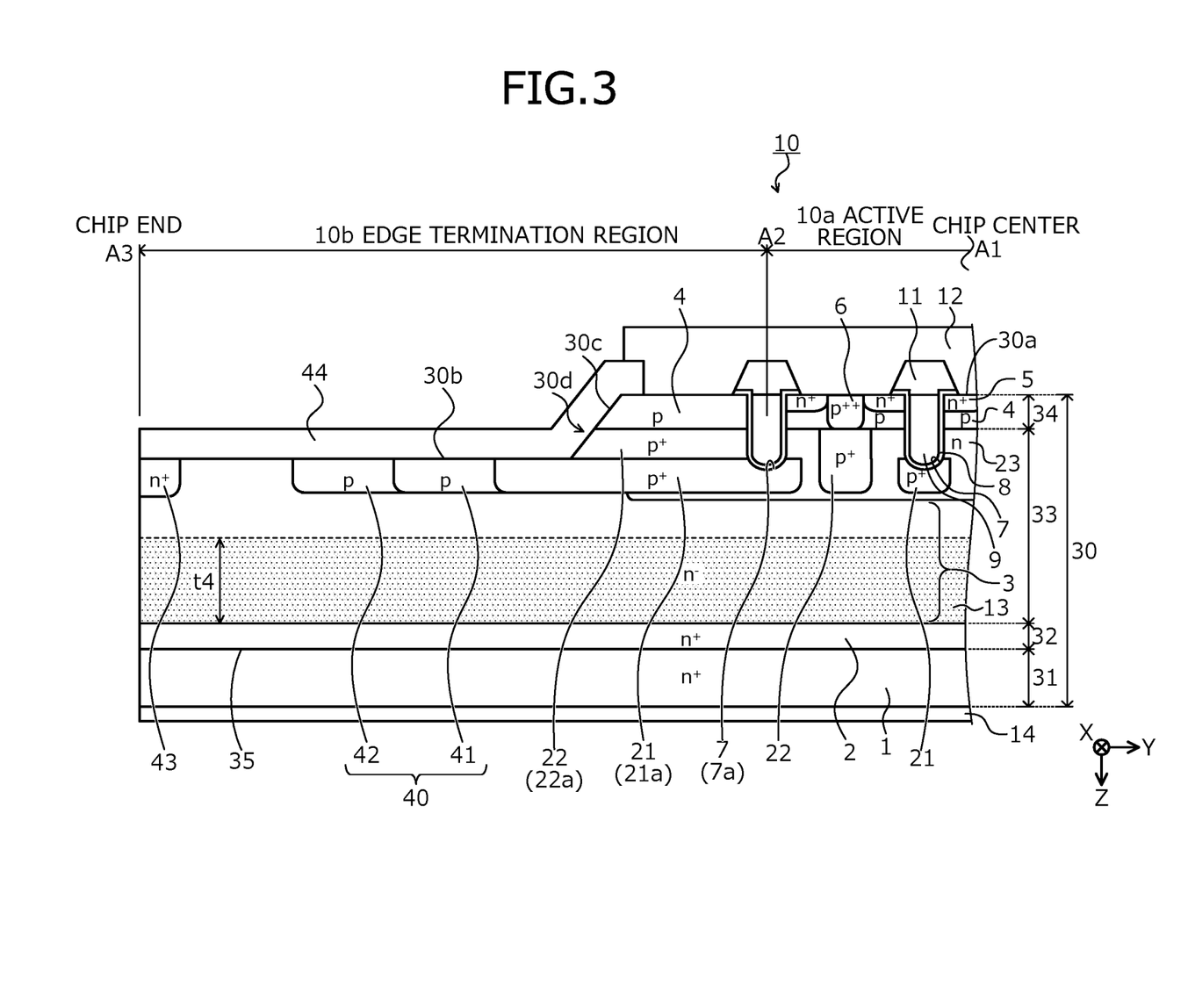
FIG. 3 is a cross-sectional view depicting the structure along cutting line A1-A2-A3 in FIG. 1.

A structure of a vertical MOSFET according to an embodiment and having a trench gate structure containing silicon carbide is described. FIG. 1 is a plan view depicting a layout when a silicon carbide semiconductor device according to the embodiment is viewed from a front side of a semiconductor substrate. FIG. 2 is a cross-sectional view of the structure along cutting line A1-A2 in FIG. 1. In FIG. 2, unit cells (constituent units of a device element) of an active region 10a are depicted. FIG. 3 is a cross-sectional view depicting the structure along cutting line A1-A2-A3 in FIG. 1. In FIG. 3, a region from near a border between the active region 10a and an edge termination region 10b to an end (chip end) of a semiconductor substrate 30 is depicted.

A silicon carbide semiconductor device 10 according to the embodiment depicted in FIGS. 1 to 3 is a trench gate MOSFET fabricated using the semiconductor substrate (semiconductor chip) 30 in which silicon carbide (SiC) is used as a semiconductor material and, for example, is useful in an instance in which a breakdown voltage is set to be about 1.2 kV. A later-described parasitic diode 20 built into the MOSFET, for example, may be used as a freewheeling diode for an inverter. The breakdown voltage is voltage allowed to an extent that no erroneous operation or destruction of the MOSFET occurs.

The semiconductor substrate 30 is an epitaxial substrate in which, epitaxial layers (first and second first-conductivity-type epitaxial layers and second-conductivity-type epitaxial layer) 32, 33, 34 constituting an n⁺-type buffer layer 2, an n⁻-type drift region 3, and a p-type base region (third semiconductor region) 4 are sequentially stacked on a front surface of an n+-type starting substrate 31 using silicon carbide as a semiconductor material. A crystal structure of the semiconductor substrate 30, for example, may be 4-layered periodic hexagonal silicon carbide crystal (4H-SiC). The semiconductor substrate 30 has a main surface that is a surface of the p-type epitaxial layer 34 and regarded as a front surface, and a main surface that is a surface of the n+-type starting substrate 31 and regard as a back surface (back surface of the n+-type starting substrate 31).

The n+-type starting substrate 31 and the epitaxial layers 32, 33 extend from a center (chip center) of the semiconductor substrate 30 to an end of the semiconductor substrate 30. The p-type epitaxial layer 34 is disposed in the active region 10a and an end of the p-type epitaxial layer 34 terminates close to a border between the active region 10a and the edge termination region 10b. Therefore, the p-type epitaxial layer 34 is exposed at a portion (hereinafter, first portion) 30a of the front surface of the semiconductor substrate 30 in the active region 10a, and the n−-type epitaxial layer 33 is exposed at a portion (hereinafter, second portion) 30b in the edge termination region 10b.

The active region 10a is a region through which a main current passes when the MOSFET is in an ON state. The active region 10a is disposed, for example, in the center of the semiconductor substrate 30. The edge termination region 10b surrounds a periphery of the active region 10a. The edge termination region 10b is a region between the active region 10a and ends of the semiconductor substrate 30; the edge termination region 10b mitigates electric field of the front side of the semiconductor substrate 30 and sustains the breakdown voltage. In the edge termination region 10b, a voltage withstanding structure such as a junction termination extension (JTE) structure 40 (refer to FIG. 3) is disposed. The voltage withstanding structure may be a spatial modulation structure in which high concentration regions and low concentration regions alternately overlap one another.

The n+-type starting substrate 31 is an n+-type drain region 1. The n+-type drain region 1, the n+-type buffer layer 2, and the n−-type drift region 3 are provided having uniform thicknesses t1, t2, t3 from the center of the semiconductor substrate 30 to the ends thereof. A thickness being uniform means that the thickness is the same within a range that includes allowable error due to process variation. The thickness t1 and an impurity concentration of the n+-type drain region 1, for example, is about 10 µm and about $6.5\times10^{18}/cm^3$, respectively. The impurity concentration of the n+-type drain region 1 suffices to be set in a range from $1.0\times10^{18}/cm^3$ to $2.0\times10^{19}/cm^3$.

At an interface (hereinafter, epi/substrate interface) 35 between the epitaxial layers 32, 33, 34 and the n+-type starting substrate 31, basal plane dislocations (BPDs) are present. The n+-type buffer layer 2 is designed so that expansion of stacking faults from BPDs in the n+-type starting substrate 31 and the epi/substrate interface 35 to the epitaxial layers 32, 33, 34 is suppressed, during forward conduction of the parasitic diode 20 formed by pn junctions (junction interfaces indicated by reference numeral 36) between p++-type contact regions 6, the p-type base region 4, p+-type regions 22, a later-described n-type current spreading region 23, the n−-type drift region 3, the n+-type buffer layer 2, and the n+-type drain region 1 in the semiconductor substrate 30.

In particular, the n+-type buffer layer 2 is the n+-type epitaxial layer 32 that has an impurity concentration at least equal to that of the n+-type drain region 1; the n+-type buffer layer 2 is epitaxially grown and doped with, for example, nitrogen (N) (first element) as an n-type dopant; and the n+-type buffer layer 2 is adjacent to the n+-type drain region 1 in a depth direction Z. The n+-type buffer layer 2 has a short minority carrier (hole) lifetime that is at most about 0.1 µs (p seconds). The thickness t2 of the n+-type buffer layer 2 is in range from 3 µm to 6.5 µm and in this case, for example, is about 3 µm. An impurity concentration of the n+-type buffer layer 2 suffices to be in a range from $7.0\times10^{18}/cm^3$ to $2.0\times10^{19}/cm^3$. While not depicted, between the n+-type drain region 1 and the n+-type buffer layer 2, a low-concentration buffer layer having an impurity concentration in a range from about $1.0\times10^{17}/cm^3$ to $1.0\times10^{18}/cm^3$ and a thickness in a range from 1 µm to 5 µm may be further provided.

The n−-type drift region 3 is a portion of the n−-type epitaxial layer 33, facing the n+-type buffer layer 2 and adjacent to the n+-type buffer layer 2 in the depth direction Z; the n−-type epitaxial layer 33 is epitaxially grown and doped with, for example, nitrogen as an n-type dopant. The thickness t3 and nitrogen concentration of the n−-type drift region 3 are, for example, about 10 µm and about $8.0\times10^{15}/cm^3$ to $1.0\times10^{16}/cm^3$, respectively. The minority carrier (hole) lifetime of a portion of the n−-type drift region 3 excluding a later-described n−-type SLR region (first semiconductor region) 13 is, for example, about 0.5 µs.

The n−-type drift region 3 has therein a region (hereinafter, n−-type SLR (short lifetime region) region) 13 having a minority carrier lifetime that is relatively shorter. The n−-type SLR region 13 is formed by so-called co-doping of nitrogen, which is doped so that an impurity concentration is in a range from about $8.0\times10^{15}/cm^3$ to $1.0\times10^{16}/cm^3$ for an n-type dopant and further by addition of vanadium (V) (second element) as an impurity, during epitaxial growth of the n−-type epitaxial layer 33. The n−-type SLR region 13 is in contact with the n+-type buffer layer 2.

The n−-type SLR region 13 has a function of reducing carriers (electrons and holes) accumulated in the n−-type drift region 3 from the n+-type buffer layer 2 and the p-type base region 4, respectively, during forward conduction of the parasitic diode 20. The minority carrier lifetime $\tau_{SLR}$ of the n−-type SLR region 13, for example, is in a range from about 0.01 µs to 0.1 µs. In an instance in which the minority carrier lifetime $\tau_{SLR}$ of the n−-type SLR region 13 exceeds the upper limit, the accumulated carrier reduction effect by the n−-type SLR region 13 may not be sufficiently obtained.

Further, vanadium in the n−-type SLR region 13 traps (captures) electrons in the n−-type SLR region 13 and therefore, when the vanadium concentration of the n−-type SLR region 13 exceeds the upper limit described above, an n-type impurity concentration of the n−-type drift region 3 is lower in the portion of the n−-type SLR region 13 and ON resistance of the MOSFET increases. The lower limit of the minority carrier lifetime $\tau_{SLR}$ of the n−-type SLR region 13 is the lifetime obtained by approximately the upper limit (for example, $1\times10^{15}/cm^3$) of the vanadium concentration of the n−-type SLR region 13 or less (refer to FIG. 10). The vanadium concentration of the n−-type SLR region 13 may be preferably in a range from $1.1\times10^{14}/cm^3$ to $1\times10^{15}/cm^3$.

A thickness t4 of the n−-type SLR region 13, between interfaces with the n−-type drift region 3 and the n+-type buffer layer 2 (hereinafter, simply, the thickness t4 of the n−-type SLR region 13) is substantially uniform from the center of the semiconductor substrate 30 to the ends of the semiconductor substrate 30. The thickness t4 of the n−-type SLR region 13 may be at least about 1 µm, which sufficient obtains the accumulated carrier reduction effect and may be at most about 5 µm. The thickness t4 of the n−-type SLR region 13 may be preferably at most 3 μm. The accumulated carrier reduction effect by the n⁻-type SLR region 13 increases as the thickness t4 of the n⁻-type SLR region 13 increases; however, saturation occurs when 5 μm is exceeded.

Due to the accumulated carrier reduction effect by the n⁻-type SLR region 13, expansion of stacking faults from BPDs of the epi/substrate interface 35 into the epitaxial layers 32, 33, 34 may be suppressed during forward conduction of the parasitic diode 20. Further, hole density injected into the n⁺-type starting substrate 31 during forward conduction of the parasitic diode 20 is reduced the closer the n⁻-type SLR region 13 is disposed to the epi/substrate interface 35 and therefore, expansion of stacking faults from BPDs in the n⁺-type starting substrate 31 to the epitaxial layers 32, 33, 34 may be suppressed.

A nitrogen concentration of the n⁻-type SLR region 13 is equal to the nitrogen concentration of the n⁻-type drift region 3. The vanadium concentration of the n⁻-type SLR region 13 is at most about 1/10 of the nitrogen concentration of the n⁻-type drift region 3. In particular, in an instance of the MOSFET having a breakdown voltage of 1.2 kV, the vanadium concentration of the n⁻-type SLR region 13, for example, is at least about $5 \times 10^{13}/cm^3$ by which the minority carrier lifetime$\tau_{SLR}$ of the n⁻-type SLR region 13 is at most the upper limit described above and preferably, may be at least $1.1 \times 10^{14}/cm^3$ but not more than, for example, about $1 \times 10^{15}/cm^3$ by which the lower limit of the minority carrier lifetime$\tau_{SLR}$ is obtained.

The p-type base region 4 is provided between the first portion 30a of the front surface of the semiconductor substrate 30 and the n⁻-type drift region 3. The p-type base region 4 extends outwardly (toward the chip ends) from the active region 10a to a later-described step 30d and is exposed at a later-described third portion 30c of the front surface of the semiconductor substrate 30. Between the p-type base region 4 and the n⁻-type drift region 3, the n-type current spreading region 23 is provided in contact with these regions. Ends of the n-type current spreading region 23 terminate closer to the center of the semiconductor substrate 30 than do ends of the p-type base region 4.

The n-type current spreading region 23, for example, is a diffused region formed by ion implantation in the n⁻-type epitaxial layer 33. The n-type current spreading region 23 is a so-called current spreading layer (CSL) that reduces carrier spreading resistance. The n-type current spreading region 23 may be omitted. In an instance in which the n-type current spreading region 23 is omitted, the p-type base region 4 is adjacent to the n⁻-type drift region 3 in the depth direction Z. Hereinafter, an instance in which the n-type current spreading region 23 is provided is described as an example.

Between the first portion 30a of the front surface of the semiconductor substrate 30 and the p-type base region 4, n⁺-type source regions (second semiconductor regions) 5 and the p⁺⁺-type contact regions 6 are each selectively provided. The n⁺-type source regions 5 and the p⁺⁺-type contact regions 6, for example, are diffused regions formed in the p-type epitaxial layer 34 by ion implantation, are in contact with the p-type base region 4, and are exposed at the first portion 30a of the front surface of the semiconductor substrate 30. The p⁺⁺-type contact regions 6 may be omitted and the p-type base region 4 may be exposed at the first portion 30a of the front surface of the semiconductor substrate 30.

Trenches 7 penetrate through the n⁺-type source regions 5 and the p-type base region 4 from the front surface of the semiconductor substrate 30 and reach the n-type current spreading region 23. Inside the trenches 7, gate electrodes 9 are provided respectively via respective gate insulating films 8. Between pairs of the trenches 7 adjacent to each other (in mesa regions), the p-type base region 4, the n⁺-type source regions 5, and the p⁺⁺-type contact regions 6 are selectively provided, and the trench gate structure is configured by the p-type base region 4, the n⁺-type source regions 5, the p⁺⁺-type contact regions 6, the trenches 7, the gate insulating films 8, and the gate electrodes 9.

Regions in the mesa regions, the trenches 7, and the gate electrodes 9, for example, are disposed in a striped pattern extending in a first direction X parallel to the front surface of the semiconductor substrate 30. Of the trenches 7, an outermost one (hereinafter, outermost trench 7a) in a second direction Y that is parallel to the front surface of the semiconductor substrate 30 and orthogonal to the first direction X, for example, has a center that is a border between the active region 10a and the edge termination region 10b. Both ends of each of the n⁺-type source regions 5 that extend in a linear shape in the first direction X terminate at the border between the active region 10a and the edge termination region 10b.

In the n-type current spreading region 23, p⁺-type regions 21, 22 are each selectively provided separate from each other. The p⁺-type regions 21, 22, for example, are diffused regions formed by ion implantation in the n⁻-type epitaxial layer 33. The p⁺-type regions 21 and portions of the p⁺-type regions 22 may be formed concurrently. The p⁺-type regions 21, 22 may be in contact with the n⁻-type drift region 3. The p⁺-type regions 21, 22 are provided separate from the n⁻-type SLR region 13, at positions closer to the n⁺-type source regions 5 than is the n⁻-type SLR region 13.

The p⁺-type regions 21, 22 are electrically connected to a source electrode (first electrode) 12 and fixed to a source potential; the p⁺-type regions 21, 22 are depleted when the MOSFET is OFF and have a function of mitigating electric field applied to bottoms of the trenches 7. The p⁺-type regions 21 are provided in plural, separate from the p-type base region 4, at positions closer to the n⁺-type drain region 1 than are interfaces between the p-type base region 4 and the n-type current spreading region 23; the p⁺-type regions 21 respectively facing the bottoms of the trenches 7 in the depth direction Z. The p⁺-type regions 22 are provided in the mesa regions, separate from the trenches 7 and the p⁺-type regions 21, and in contact with the p-type base region 4.

The p⁺-type region 21 facing the outermost trench 7a in the depth direction Z (hereinafter, outermost p⁺-type region 21a) extends closer to the chip end than does the later-described step 30d and is exposed at the second portion 30b of the front surface of the semiconductor substrate 30. The outermost p⁺-type region 21a is connected, in the depth direction Z, to the p-type base region 4 in the edge termination region 10b (portion of the p-type base region 4, between the third portion 30c of the front surface of the semiconductor substrate 30 and the outermost trench 7a), via one of the p⁺-type regions 22 (hereinafter, outermost p⁺-type region 22a).

The outermost p⁺-type region 22a is exposed at the third portion 30c of the front surface of the semiconductor substrate 30 and at a sidewall of the outermost trench 7a, the sidewall closest to the chip end. The p-type base region 4 in the edge termination region 10b is free of the n⁺-type source regions 5 and the p⁺⁺-type contact regions 6. In an instance in which the n-type current spreading region 23 is omitted, the trenches 7 penetrate through the n⁺-type source regions 5 and the p-type base region 4 from the front surface of the semiconductor substrate 30 and reach the n⁻-type drift region 3; and the p⁺-type regions 21, 22 are selectively provided in the n⁻-type drift region 3.

An interlayer insulating film 11 is provided in an entire area of the first portion 30a of the front surface of the semiconductor substrate 30 and covers the gate electrodes 9. The source electrode 12 is provided in an entire area of the first portion 30a of the front surface of the semiconductor substrate 30, in contact with the n⁺-type source regions 5 and the p⁺⁺-type contact regions 6 via contact holes, and electrically connected to the p-type base region 4, the n⁺-type source regions 5, and the p⁺⁺-type contact regions 6. In an instance in which the p⁺⁺-type contact regions 6 are omitted, the source electrode 12 is in contact with the p-type base region 4 instead of the p⁺⁺-type contact regions 6.

Further, the source electrode 12 is in contact with the p-type base region 4 in the edge termination region 10b via a contact hole. The source electrode 12 may extend on a later-described field oxide film 44 on the first portion 30a of the front surface of the semiconductor substrate 30. Excluding the source electrode pad 12a and a gate electrode pad 15, an entire of the front surface of the semiconductor substrate 30 is protected by a passivation film (not depicted). The source electrode pad 12a is a portion of the source electrode 12 exposed by an opening of the passivation film (not depicted).

In the active region 10a, the gate electrode pad 15 is provided separate from the source electrode 12, on the interlayer insulating film 11 of the front surface of the semiconductor substrate 30. All of the gate electrodes 9 are electrically connected to the gate electrode pad 15, via a gate runner (not depicted). In an entire area of a back surface of the semiconductor substrate 30 (back surface of the n⁺-type starting substrate 31), a drain electrode (second electrode) 14 is provided. The drain electrode 14 is in contact with the n⁺-type drain region 1 (the n⁺-type starting substrate 31) and connected to the n⁺-type drain region 1.

In the edge termination region 10b, for example, in an entire area of the edge termination region 10b, the p-type epitaxial layer 34 is removed, whereby the step 30d where a portion (the second portion 30b) of the front surface of the semiconductor substrate 30 is lower (recessed toward the drain) in the edge termination region 10b than a portion (the first portion 30a) thereof in the active region 10a is formed. The step 30d is formed at the front surface of the semiconductor substrate 30, whereby the n⁻-type epitaxial layer 33 is exposed at the second portion 30b of the front surface of the semiconductor substrate 30, closer to the chip end than is the step 30d.

As described above, the outermost p⁺-type region 21a is exposed at the second portion 30b of the front surface of the semiconductor substrate 30, on an inner side (side closest to the chip center) of the second portion 30b. As described above, the p-type base region 4 and the outermost p⁺-type region 22a are exposed at a portion (mesa edge of the step 30d, hereinafter, third portion) 30c of the front surface of the semiconductor substrate 30, between the first and the second portions 30a, 30b. Exposure at the second and the third portions 30b, 30c of the front surface of the semiconductor substrate 30 means being disposed in a surface region of the second and the third portions 30b, 30c of the front surface of the semiconductor substrate 30 and being in contact with the field oxide film 44.

A JTE structure 40 is provided in the surface region of the second portion 30b of the front surface of the semiconductor substrate 30, the JTE structure 40 being adjacent to the outermost p⁺-type region 21a and closer to the chip end than is the outermost p⁺-type region 21a. The JTE structure 40 is a voltage withstanding structure in which multiple p-type regions (herein, 2, respectively, first and second JTE regions 41, 42 from the chip center) are disposed adjacent to each other in descending order of p-type impurity concentration from the chip center. The first JTE region 41 is adjacent to an outer side of the outermost p⁺-type region 21a. The second JTE region 42 is adjacent to an outer side of the first JTE region 41.

The first and the second JTE regions 41, 42, for example, are diffused regions formed by ion implantation in the n⁻-type epitaxial layer 33 and provided at a depth not reaching the n⁻-type SLR region 13. The p-type impurity concentration of the first and the second JTE regions 41, 42 is higher than the n-type impurity concentration of the n⁻-type epitaxial layer 33 (the n⁻-type drift region 3) and lower than a p⁺-type impurity concentration of the outermost p⁺-type region 21a. A predetermined breakdown voltage of the edge termination region 10b is ensured by pn junctions between the first and the second JTE regions 41, 42 and the n⁻-type drift region 3. Reference numeral 43 is an n⁺-type channel stopper region.

Figure 6:
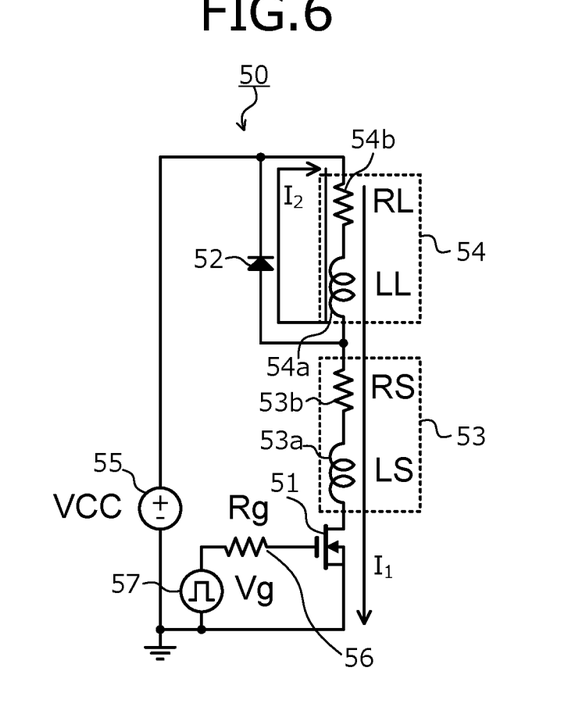
FIG. 6 is an equivalent circuit diagram depicting a circuit configuration of a chopper circuit used in a simulation of the first example.

Dynamic characteristics during switching were verified for the silicon carbide semiconductor device 10 according to the embodiment. FIGS. 4 and 5 are characteristics diagrams respectively depicting a reverse current waveform and a reverse voltage waveform of a parasitic diode of a first example. FIG. 6 is an equivalent circuit diagram depicting a circuit configuration of a chopper circuit used in a simulation of the first example. FIG. 6 depicts an equivalent circuit diagram of a chopper circuit 50 used in simulations of a current waveform of the reverse current Irr and a voltage waveform of the reverse voltage Vr of the parasitic diode 20 of the silicon carbide semiconductor device 10 described above according to the embodiment (refer to FIG. 2, hereinafter, the first example).

In FIG. 6, the chopper circuit 50 has a MOSFET 51, a diode 52, circuit parasitic impedance 53, load impedance 54, a power source 55, gate resistance 56, and a drive circuit 57. The MOSFET 51 is assumed to be the silicon carbide semiconductor device 10 according to the embodiment (refer to FIGS. 1 to 3). The MOSFET 51 is a MOSFET with a breakdown voltage of 1.2 kV and that uses silicon carbide as a semiconductor material and has the n⁻-type SLR region 13 in the n⁻-type drift region (refer to FIG. 2). A drain of the MOSFET 51 is connected to a positive electrode of the power source 55, via the circuit parasitic impedance 53 and the load impedance 54. A source of the MOSFET 51 is connected to a negative electrode of the power source 55.

The diode 52 simulates the parasitic diode 20 of the silicon carbide semiconductor device 10 according to the embodiment (refer to FIG. 2). The diode 52 is a pin (p-intrinsic-n) diode with a breakdown voltage of 1.2 kV and that uses silicon carbide as a semiconductor material and has a function of rectifying current flowing to the drain of the MOSFET 51 when the MOSFET 51 is OFF. The diode 52 has the n⁻-type SLR region 13 in the n⁻-type drift region that is an i-layer. The diode 52, between the drain and the source of the MOSFET 51, is connected in antiparallel to the load impedance 54. The circuit parasitic impedance 53 is connected between the diode 52 and the MOSFET 51.

The minority carrier lifetime $\tau_{SLR}$ of the n⁻-type SLR region 13 is assumed to be 0.03 µs. The circuit parasitic impedance 53 is obtained from the inductance (hereinafter, circuit parasitic inductance) 53a and a resistance component (hereinafter, circuit parasitic resistance) 53b. In the calculation of verification results, the circuit parasitic inductance 53a and the circuit parasitic resistance 53b are assumed to be 35 µH and 16.3Ω, respectively. The load impedance 54 is obtained from the impedance (hereinafter, load impedance) 54a of load and a resistance component (hereinafter, load resistance) 54b. In the calculation of the verification results, the load impedance 54a and the load resistance 54b are assumed to be 50 mH and 0.01Ω, respectively.

Simulation results for the reverse current waveform and reverse voltage waveform of the parasitic diode 20 of the first example, using the diode 52 of the chopper circuit 50 in FIG. 6 are shown in FIGS. 4 and 5, respectively. FIGS. 4 and 5 respectively show two specimens of the first example in which the thickness t4 of the n⁻-type SLR region 13 was 2.5 µm and 5.0 µm, respectively. FIGS. 4 and 5 further show simulation results for the parasitic diode 120 of the conventional silicon carbide semiconductor device 110 (refer to FIG. 11, hereinafter, the conventional example). At the end of notes in legends of FIGS. 4 and 5, whether the n⁻-type SLR region 13 is present "SLR" or not present "no SLR" is indicated and in an instance of the n⁻-type SLR region 13 being present, the thickness t4 thereof is further indicated thereafter.

The chopper circuit used in simulating the parasitic diode 120 of the conventional example includes a MOSFET and a diode that are free of the n⁻-type SLR region 13, instead of the MOSFET 51 and the diode 52 of the chopper circuit 50 in FIG. 6. The MOSFET that is free of the n⁻-type SLR region 13 is assumed to be the conventional silicon carbide semiconductor device 110. The diode that is free of the n⁻-type SLR region 13 simulates the parasitic diode 120 of the conventional silicon carbide semiconductor device 110. Simulation conditions for the conventional example are similar to simulation conditions for the first example.

When a gate voltage of +20V is supplied from the drive circuit 57 to a gate of the MOSFET 51 via the gate resistance 56 and the MOSFET 51 is turned ON, a current $I_1$ passes through the load impedance 54, the circuit parasitic impedance 53, and the MOSFET 51 due to a constant power supply voltage VCC. Subsequently, when a gate voltage of −5V is supplied from the drive circuit 57 to the gate of the MOSFET 51 via the gate resistance 56 and the MOSFET 51 turns OFF, the diode 52 is forward energized and a current $I_2$ passes through the load impedance 54 and the diode 52. Thereafter, again, when the MOSFET 51 is turned ON, the diode 52 is reverse biased and is switched from an ON state to an OFF state.

At this time, by a reverse recovery process of the diode 52, while a current peak (maximum value, hereinafter, reverse current peak) Irr_peak of the reverse current Irr of the diode 52 increases, from the results shown in FIG. 4, it was confirmed that in the first example, the reverse current peak Irr_peak of the diode 52 is reduced more than that in the conventional example (refer to FIG. 4). A reason for this is that the n⁻-type SLR region 13 is provided in the n⁻-type drift region 3 of the first example, whereby compared to the conventional example, when the diode 52 is forward energized, carriers (electrons and holes) accumulated in the n⁻-type drift region 3 may be decreased.

Further, by the reverse recovery process of the diode 52, due to the circuit parasitic inductance 53a between a cathode and an anode of the diode 52, a surge voltage greater than the power supply voltage VCC is applied. Due to this surge voltage, the waveform of the reverse voltage Vr of the diode 52 oscillates and has a voltage peak (hereinafter, reverse voltage peak) Vr_peak higher than the power supply voltage VCC; however, from the results shown in FIG. 5, it was confirmed that in the first example, the reverse current peak Irr_peak of the diode 52 is reduced more than that in the conventional example, whereby it was confirmed that the reverse voltage peak Vr_peak of the diode 52 is also reduced more than that in the conventional example (refer to FIG. 5).

Figure 7:
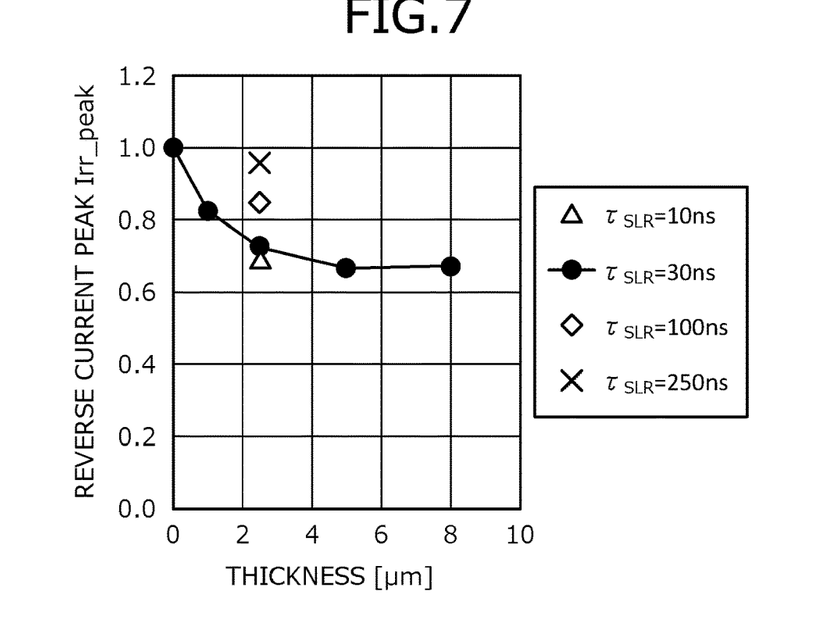
FIG. 7 is a characteristics diagram depicting a relationship between thickness of an n⁻-type SLR region of a second example and the reverse current peak of a parasitic diode.
Figure 8:
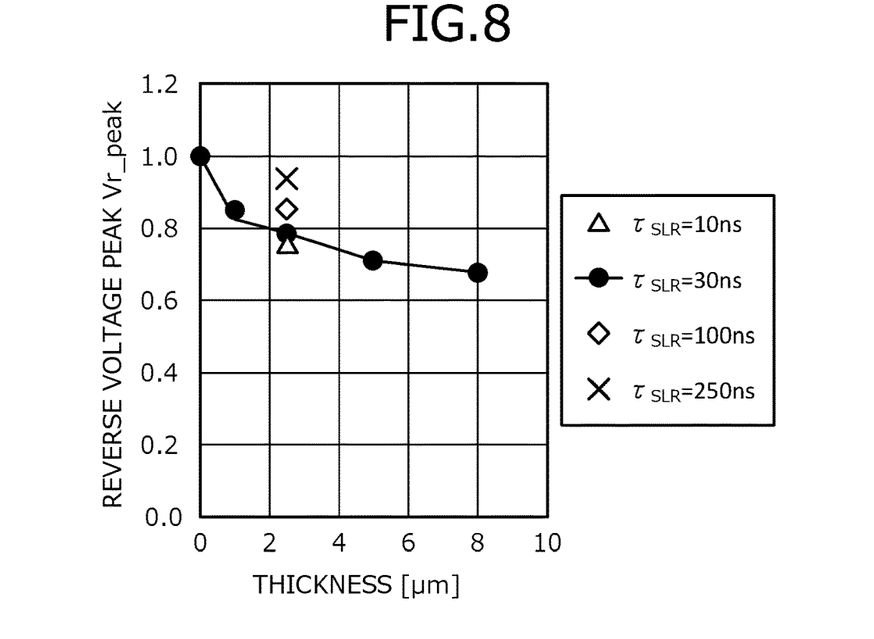
FIG. 8 is a characteristics diagram depicting a relationship between the thickness of the n⁻-type SLR region of the second example and the reverse voltage peak of the parasitic diode.

The thickness t4 of the n⁻-type SLR region 13 was verified. FIGS. 7 and 8 are characteristics diagrams respectively depicting relationships between the thickness of the n⁻-type SLR region of a second example and the reverse current peak and the reverse voltage peak of a parasitic diode. In FIG. 7, a vertical axis indicates the reverse current peak Irr_peak of the parasitic diode 20 of the second example as a proportion (=the reverse current peak Irr_peak of the parasitic diode 20 of the second example/the reverse current peak Irr_peak of the parasitic diode 120 of the conventional example) based on the reverse current peak Irr_peak of the parasitic diode 120 of the described conventional example as a reference (=1).

In FIG. 8, a vertical axis indicates the reverse voltage peak Vr_peak of the parasitic diode 20 of the second example as a proportion (=the reverse voltage peak Vr_peak of the parasitic diode 20 of the second example/the reverse voltage peak Vr_peak of the parasitic diode 120 of the conventional example) based on the reverse voltage peak Vr_peak of the parasitic diode 120 of the described conventional example as a reference (=1). In FIGS. 7 and 8, horizontal axes indicate the thickness (thickness from interfaces with the n⁻-type drift region 3 and the n⁺-type buffer layer 2) t4 of the n⁻-type SLR region 13 of the silicon carbide semiconductor device 10 according to the embodiment (hereinafter, the second example).

Results of simulating the reverse voltage peak Vr_peak and the reverse voltage peak Vr_peak of the parasitic diode 20 of the second example by variously changing the thickness t4 of the n⁻-type SLR region 13 are shown in FIGS. 7 and 8, respectively. FIGS. 7 and 8 show four specimens of the second example in which the minority carrier lifetime$\tau_{SLR}$ of the n⁻-type SLR region 13 was assumed to be 0.01 µs, 0.03 µs, 0.1 µs, and 0.25 µs. In these simulations as well, the chopper circuit 50 in FIG. 6 described above and having the diode 52 that simulates the parasitic diode 20 of the silicon carbide semiconductor device 10 according to the embodiment was used.

From the results shown in FIGS. 7 and 8, it was confirmed that in the second example, the reverse current peak Irr_peak and the reverse voltage peak Vr_peak of the parasitic diode 20 may both reduced as compared to the conventional example, the greater the thickness t4 of the n⁻-type SLR region 13 is set. A reason for this is that the n⁻-type SLR region 13 is provided in the n⁻-type drift region 3 of the second example, whereby carriers (electrons and holes) accumulated in the n⁻-type drift region 3 during forward conduction of the diode 52 may be reduced more than in the conventional example the greater is the thickness t4 of the n⁻-type SLR region 13.

Uniformity and accuracy of the thickness t4 of the n⁻-type SLR region 13 may be stabilized and controlled by processing, for example, to at least about 1 µm. When the thickness t4 of the n⁻-type SLR region 13 is thinner than 1 µm, effects of differences in film thickness (the thickness t4) of the n⁻-type SLR region 13 in a plane of the semiconductor wafer (the semiconductor substrate 30) or between semiconductor wafers increases and the reverse current peak Irr_peak and the reverse voltage peak Vr_peak greatly vary for each device element and therefore, is not desirable.

Further, when the thickness t4 of the n⁻-type SLR region 13 exceeds 5 µm, the reverse current peak Irr_peak and the reverse voltage peak Vr_peak of the parasitic diode 20 both tend to be saturated. As reason for this is that even when the thickness t4 of the n⁻-type SLR region 13 is at least 5 μm, majority carrier (electron) density in the n⁻-type drift region 3 does not greatly change. Therefore, the upper limit value of the thickness t4 of the n⁻-type SLR region 13 may be preferably about 5 μm.

Figure 9:
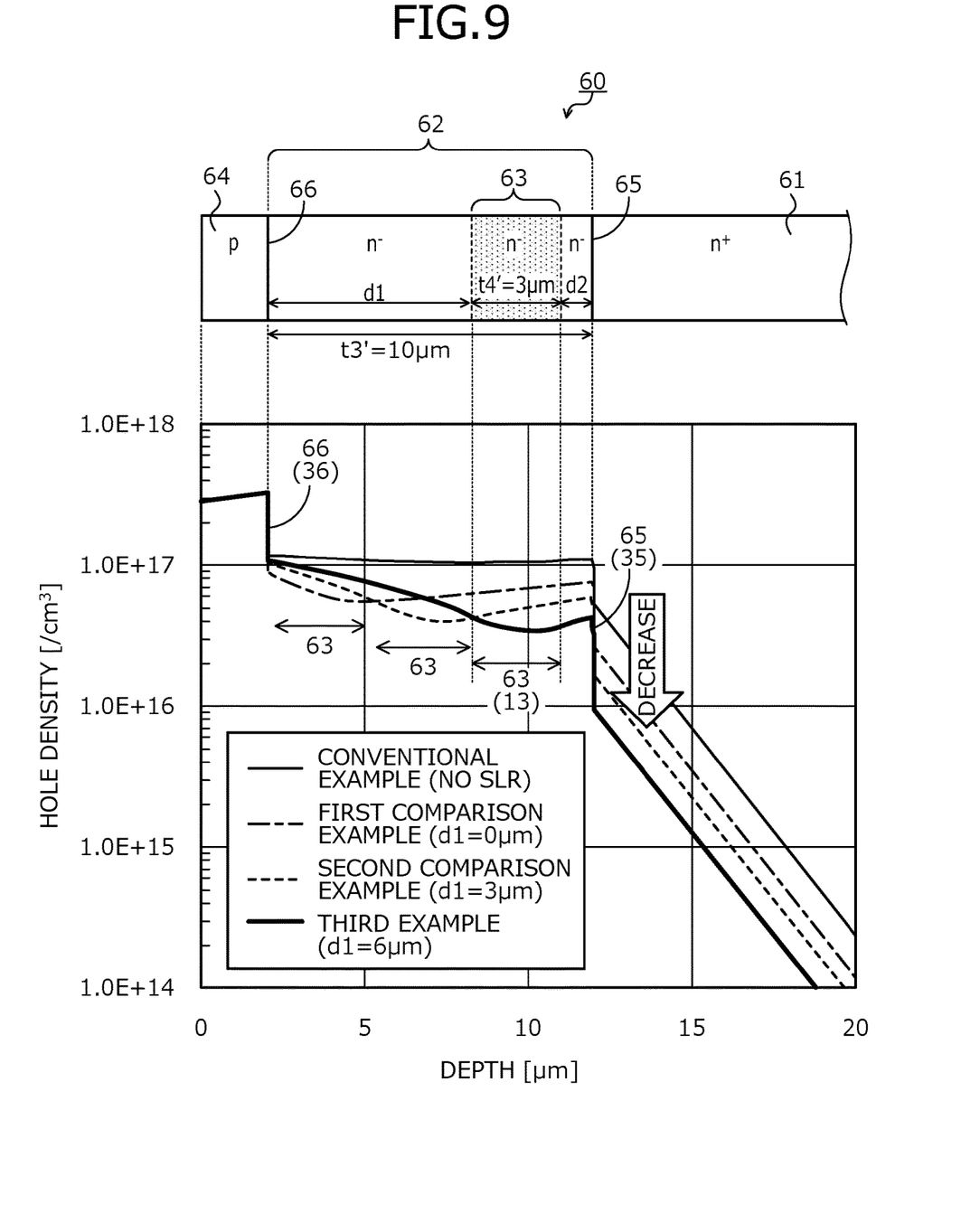
FIG. 9 is a characteristics diagram depicting depth position of the n⁻-type SLR region of a third example.

Depth position of the thickness t4 of the n⁻-type SLR region 13 was verified. FIG. 9 is a characteristics diagram depicting depth position of the n⁻-type SLR region of a third example. Results of simulation of hole density distribution during forward conduction of a pin diode 60 (refer to FIG. 2, hereinafter, third example) that simulates the parasitic diode 20 of the silicon carbide semiconductor device 10 according to the embodiment described above are shown in FIG. 9. Current density of a pn junction interface 66 between a p-type anode region 64 and an n⁻-type drift region 62 of the pin diode 60 is assumed to be 500 A/cm² at room temperature (25 degrees C.).

An n⁺-type cathode region 61, the n⁻-type drift region 62, an n⁻-type SLR region 63, and the p-type anode region 64 of the pin diode 60 are respectively assumed to be the n⁺-type drain region 1 (the n⁺-type starting substrate 31), the n⁻-type drift region 3 (the n⁻-type epitaxial layer 33), the n⁻-type SLR region 13, and the p-type base region 4 (the p-type epitaxial layer 34) of the silicon carbide semiconductor device 10 according to the embodiment. The thickness and the impurity concentration of the n⁺-type cathode region 61 are respectively a same as the thickness t1 and the impurity concentration of the n⁺-type drain region 1.

A thickness t3', impurity concentration, and minority carrier lifetime of the n⁻-type drift region 62 are assumed to be a same as the thickness t3 and the impurity concentration of the n⁻-type drift region 3. A thickness and an impurity concentration of the p-type anode region 64 are assumed to be 2 μm and $6.5 \times 10^{18}$/cm³, respectively. A thickness t4' of the n⁻-type SLR region 63 is assumed to be 3 μm. The n⁻-type SLR region 63 is disposed at a depth position that is a distance d1 of 6 μm from the pn junction interface 66 between the p-type anode region 64 and the n⁻-type drift region 62 (pn junction interfaces of the parasitic diode 20 in FIG. 2, in other words, corresponds to the interfaces between the p⁺-type regions 22 and the n-type current spreading region 23), in direction toward the n⁺-type cathode region 61.

Therefore, a distance d2 between the n⁻-type SLR region 63 and an epi/substrate interface 65 is 1 μm. Regarding the depth position of the n⁻-type SLR region 63 of the third example, an instance is assumed in which between the n⁻-type SLR region 63 and the epi/substrate interface 65 (corresponds to the epi/substrate interface 35 in FIG. 2), the n⁺-type buffer layer 2 of the silicon carbide semiconductor device 10 according to the embodiment is disposed in contact with the n⁻-type SLR region 63 and the n⁺-type cathode region 61. A minority carrier lifetime $\tau_{SLR}$ of the n⁻-type SLR region 63 is assumed to be 0.03 μs.

Further, in FIG. 9, results of simulation of hole density distribution for the conventional example described above (refer to FIG. 11) and first and second comparison examples are shown. The conventional example differs from the third example in that the n⁻-type SLR region 63 is not provided. The first and the second comparison examples differ from the third example in that the distance d1 from the pn junction interface 66 between the p-type anode region 64 and the n⁻-type drift region 62 to the n⁻-type SLR region 63 is shorter than that in the third example. In the first and the second comparison examples, the distance d1 from the pn junction interface 66 between the p-type anode region 64 and the n⁻-type drift region 62 to the n⁻-type SLR region 63 are assumed to be 0 μm and 3 μm, respectively.

In FIG. 9, a region that includes an area where a hole density of the n⁻-type drift region 62 is low is the n⁻-type SLR region 63. The depth position of the n⁻-type SLR region 63 of the first and the second comparison examples is indicated in the hole density distribution in FIG. 9. In FIG. 9, a horizontal axis indicates depth from an interface between the p-type anode region 64 and an anode electrode (not depicted) and a vertical axis indicates hole density in the semiconductor substrate. In FIG. 9, the distance d1 from the pn junction interface 66 between the p-type anode region 64 and the n⁻-type drift region 62 to the n⁻-type SLR region 63 is indicated at the end of the notes for the third example and the first and the second comparison examples in the legend, and "no SLR" is indicated at the end of the note for the conventional example in the legend.

From the results shown in FIG. 9, it was confirmed that in the third example and the first and the second comparison examples, the hole density of the n⁻-type drift region 62 during forward conduction of the pin diode 60 is lowest in the n⁻-type SLR region 63 and is reduced in an entire area of the n⁻-type drift region 62, and a density of holes injected in the n⁺-type cathode region 61 is reduced, as compared to the conventional example. Further, in comparing the third example and the first and the second comparison examples, it was confirmed that a hole density reduction effect by the n⁻-type SLR region 63 was highest for the third example having the n⁻-type SLR region 63 at a position closest to the epi/substrate interface 65.

Therefore, in the third example, in the n⁻-type drift region 62, the n⁻-type SLR region 63 is provided at a position closer to the epi/substrate interface 65 than in the first and the second comparison examples, whereby even when the thickness (the distance d2) of the n⁺-type buffer layer 2 is thin, i.e., 1 μm, and during forward conduction of the pin diode 60, expansion of stacking faults from BPDs in the n⁺-type cathode region 61 (n⁺-type starting substrate) and the epi/substrate interface 65 to the n⁻-type drift region 62 and the p-type anode region 64 (epitaxial layer) may be suppressed.

The simulation results described for the second and the third examples (refer to FIGS. 7 to 9) have a same tendency even in an instance in which the minority carrier lifetime $\tau_{SLR}$ of the n⁻-type SLR region 13 is in a range from 0.01 μs to 0.1 μs.

Figure 10:
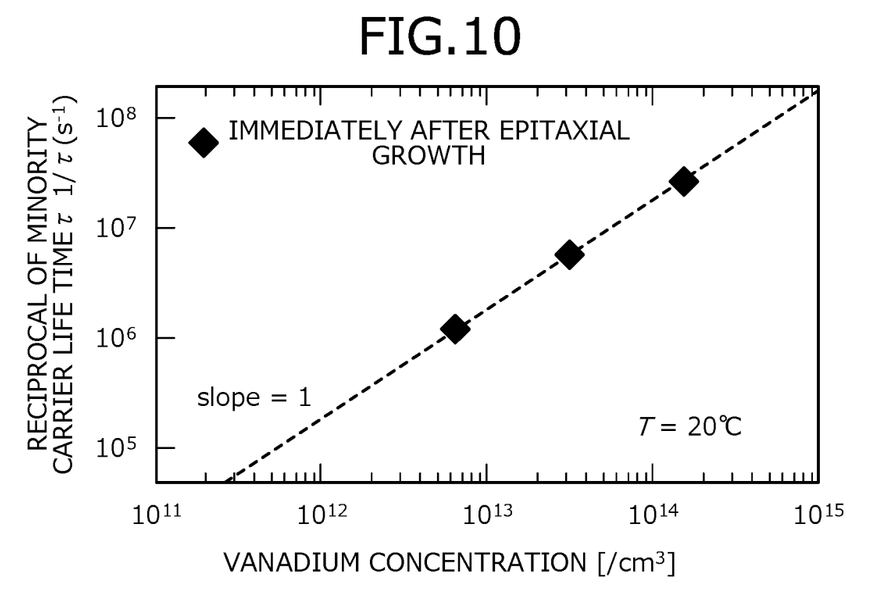
FIG. 10 is a characteristics diagram showing a relationship between minority carrier lifetime and vanadium concentration of an n-type silicon carbide epitaxial layer.

Next, a relationship between minority carrier (hole) lifetime and vanadium concentration of the n-type silicon carbide epitaxial layer is described. FIG. 10 is a characteristics diagram showing a relationship between minority carrier lifetime and vanadium concentration of the n-type silicon carbide epitaxial layer. FIG. 10 depicts the minority carrier lifetime of the n-type silicon carbide epitaxial layer immediately after epitaxial growth. In FIG. 10, a horizontal axis indicates the vanadium concentration [/cm³] of the n-type silicon carbide epitaxial layer and a vertical axis indicates a reciprocal $1/\tau[s^{-1}]$ of the minority carrier lifetime of the n-type silicon carbide epitaxial layer.

FIG. 10 indicates that the greater is the value on the vertical axis, the shorter is the minority carrier lifetime τ of the n-type silicon carbide epitaxial layer. A substrate temperature T during measurement of the minority carrier lifetime of the n-type silicon carbide epitaxial layer is 20 degrees C. The substrate temperature is the temperature of the semiconductor substrate 30 (refer to FIGS. 1 to 3). A reciprocal of the vanadium concentration and the minority carrier lifetime indicates a proportional relationship (slope=1). Vanadium is known to form recombination centers in the n-type silicon carbide epitaxial layer and to reduce the minority carrier lifetime of the n-type silicon carbide epitaxial layer.

As depicted in FIG. 10, the inventors further discovered that by adding vanadium to the n-type silicon carbide epitaxial layer, the minority carrier lifetime τ of the n-type silicon carbide epitaxial layer can be maintained at a low minority carrier lifetime. For example, in the n-type silicon carbide epitaxial layer doped with nitrogen and having a vanadium concentration of about $1 \times 10^{15}/cm^3$, the minority carrier lifetime can be set to about 0.01 μs ($=10^{-8}$ s).

As described above, according to the embodiment, by providing the n⁻-type SLR region in the n⁻-type drift region, the carriers (electrons and holes) accumulated in the n⁻-type drift region during forward conduction of the parasitic diode of the MOSFET may be reduced. As a result, when reverse voltage is applied to the parasitic diode of the MOSFET and the carriers accumulated in the n⁻-type drift region are discharged, the current peak of the reverse current passing through the parasitic diode may be reduced more than that in a conventional structure and the voltage peak of the reverse voltage applied to the parasitic diode may be reduced, thereby enabling reduction of the surge voltage.

Further, according to the embodiment, the n⁻-type SLR region is provided in the n⁻-type drift region, whereby the hole density injected into the n⁻-type drift region (epitaxial layer) during forward conduction of the parasitic diode of the MOSFET is reduced and therefore, expansion of stacking faults into the epitaxial layer from BPDs of the epi/substrate interface may be suppressed. Further, the n⁻-type SLR region is provided adjacent to the n⁺-type buffer layer, whereby the hole density injected into the n⁺-type starting substrate from the epitaxial layer during forward conduction of the parasitic diode may be reduced and therefore, expansion of stacking faults into the epitaxial layer from BPDs in the n⁺-type starting substrate may be suppressed.

In the foregoing, the present invention is not limited to the embodiments described above and various modifications within a range not departing from the spirit of the invention are possible. For example, during epitaxial growth of the n⁻-type epitaxial layer doped with nitrogen and constituting the n⁻-type drift region, by adding vanadium as an impurity by co-doping, instead of forming the n⁻-type SLR region, between the n⁺-type epitaxial layer constituting the n⁺-type buffer layer and the n⁻-type epitaxial layer constituting the n⁻-type drift region, nitrogen and vanadium may be doped and an n⁻-type epitaxial layer constituting the n⁻-type SLR region may be epitaxial grown.

As described above, the hole density injected into the n⁻-type drift region (first-conductivity-type epitaxial layer) during forward conduction of the parasitic diode is reduced. Further, the carriers (electrons and holes) accumulated in the n⁻-type drift region during forward conduction of the parasitic diode may be reduced. As a result, when reverse voltage is applied to the parasitic diode of the MOSFET and the carriers accumulated in the n⁻-type drift region are discharged, the current peak of the reverse current that passes through the parasitic diode may be reduced more than that in the conventional structure and the voltage peak of the reverse voltage applied to the parasitic diode may be reduced.

The vertical MOSFET according to the present invention and having the trench gate structure containing silicon carbide achieves an effect in that expansion of stacking faults may be suppressed and surge voltage may be reduced.

As described above, the vertical MOSFET according to the present invention and having the trench gate structure containing silicon carbide is useful for power semiconductor devices used in power converting equipment, power source devices such as in various types of industrial machines, etc. and in particular, is suitable for a MOSFET used in an inverter circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A vertical metal oxide semiconductor field effect transistor (MOSFET) containing silicon carbide and having a pn junction interface through which a current passes in a forward direction, the vertical MOSFET comprising:
    a starting substrate of a first conductivity type, having a first surface and a second surface opposite to each other;
    a first first-conductivity-type epitaxial layer containing silicon carbide;
    a second first-conductivity-type epitaxial layer containing silicon carbide, provided on the first surface of the starting substrate via the first first-conductivity-type epitaxial layer, the second first-conductivity-type epitaxial layer containing silicon carbide having an impurity concentration lower than an impurity concentration of the starting substrate and an impurity concentration of the first first-conductivity-type epitaxial layer, the second first-conductivity-type epitaxial layer further containing, as an impurity thereof, a first element that is a dopant of the first conductivity type;
    a first semiconductor region of the first conductivity type, provided as a portion of the second first-conductivity-type epitaxial layer, in contact with the first first-conductivity-type epitaxial layer, the first semiconductor region having, as an impurity thereof, the first element and a second element, the second element forming recombination centers;
    a second-conductivity-type epitaxial layer containing silicon carbide, the second-conductivity-type epitaxial layer forming the pn junction interface with the second first-conductivity-type epitaxial layer and supplying a minority carrier to the second first-conductivity-type epitaxial layer that includes the first semiconductor region;
    a plurality of second semiconductor regions of the first conductivity type, selectively provided in the second-conductivity-type epitaxial layer;
    a plurality of trenches that penetrate through the plurality of second semiconductor regions, respectively, and through the second-conductivity-type epitaxial layer, and reach the second first-conductivity-type epitaxial layer;
    a plurality of gate electrodes that are provided in the plurality of trenches via a plurality of gate insulating films, respectively;
    a first electrode electrically connected to the second semiconductor regions and the second-conductivity-type epitaxial layer; and
    a second electrode electrically connected to the second surface of the starting substrate, wherein
    a lifetime of the minority carrier of the first semiconductor region is shorter than a lifetime of the minority carrier of another portion of the second first-conductivity-type epitaxial layer excluding the first semiconductor region, a concentration of the second element in the first semiconductor region is at most $\frac{1}{10}$ of a concentration of the first element in the second first-conductivity-type epitaxial layer, the first element is nitrogen, the second element is vanadium, and the concentration of the second element in the first semiconductor region is in a range from $5\times10^{13}/cm^3$ to $1\times10^{15}/cm^3$.

2. The vertical MOSFET according to claim 1, wherein the concentration of the second element is at least $1\times10^{14}/cm^3$.

3. The vertical MOSFET according to claim 1, wherein the concentration of the first element in the first semiconductor region is in a range from $8.0\times10^{15}/cm^3$ to $1.0\times10^{16}/cm^3$.

4. The vertical MOSFET according to claim 1, wherein the first first-conductivity-type epitaxial layer has a thickness in a range from 3 μm to 6.5 μm, and the impurity concentration thereof is in a range from $7.0\times10^{18}/cm^3$ to $2.0\times10^{19}/cm^3$.

5. The vertical MOSFET according to claim 1, wherein the first semiconductor region has a thickness that is in a range from 1 μm to 5 μm.

6. The vertical MOSFET according to claim 1, wherein the lifetime of the minority carrier of the first semiconductor region is in a range from 0.01 μs to 0.1 μs.

7. The vertical MOSFET according to claim 1, wherein a breakdown voltage of the vertical MOSFET is 1.2 kV.

\* \* \* \* \*